United States Patent
Park et al.

(10) Patent No.: US 11,121,195 B2
(45) Date of Patent: Sep. 14, 2021

(54) ORGANIC LIGHT EMITTING DISPLAY DEVICE

(71) Applicant: Samsung Display Co., Ltd., Yongin-Si (KR)

(72) Inventors: Sang Jin Park, Yongin-si (KR); Min Jae Jeong, Yongin-si (KR); Hee Na Kim, Yongin-si (KR); Young Seok Baek, Yongin-si (KR); Dong Hyun Yang, Yongin-si (KR)

(73) Assignee: Samsung Display Co., Ltd.

( * ) Notice: Subject to any disclaimer, the term of this patent is extended or adjusted under 35 U.S.C. 154(b) by 6 days.

(21) Appl. No.: 16/387,468

(22) Filed: Apr. 17, 2019

(65) Prior Publication Data

US 2020/0119108 A1 Apr. 16, 2020

(30) Foreign Application Priority Data

Oct. 11, 2018 (KR) .................... 10-2018-0121396

(51) Int. Cl.
*H01L 27/32* (2006.01)
*G06F 3/041* (2006.01)
*G06K 9/00* (2006.01)

(52) U.S. Cl.
CPC ........ *H01L 27/3234* (2013.01); *G06F 3/0412* (2013.01); *G06K 9/0004* (2013.01); *H01L 27/3227* (2013.01); *H01L 27/3244* (2013.01); *H01L 2227/323* (2013.01)

(58) Field of Classification Search
CPC ... H01L 27/32; H01L 27/322; H01L 27/3225; H01L 27/3227; H01L 27/3232; H01L 27/3234; H01L 27/3244; H01L 2227/323; G06F 3/0412; G06K 9/0004
USPC ........................................ 345/175
See application file for complete search history.

(56) References Cited

U.S. PATENT DOCUMENTS

| | | | |
|---|---|---|---|
| 6,177,711 B1* | 1/2001 | Kariya | H01L 31/075 257/458 |
| 2008/0048283 A1* | 2/2008 | Han | H01L 27/14609 257/432 |
| 2010/0026866 A1* | 2/2010 | Matsumoto | H04N 5/378 348/308 |
| 2012/0154704 A1* | 6/2012 | Nakazawa | H01L 27/1214 349/43 |
| 2015/0179840 A1 | 6/2015 | Watanabe et al. | |
| 2018/0085792 A1 | 3/2018 | Safai et al. | |
| 2019/0205602 A1* | 7/2019 | Cao | G06F 3/0421 |
| 2020/0104563 A1* | 4/2020 | Ryu | G06F 3/042 |
| 2020/0111815 A1* | 4/2020 | Lius | G09G 3/3225 |

FOREIGN PATENT DOCUMENTS

| | | |
|---|---|---|
| KR | 10-1349924 B1 | 1/2014 |
| KR | 10-2017-0080108 A | 7/2017 |
| WO | 2014/024554 A1 | 2/2014 |

* cited by examiner

*Primary Examiner* — Jason M Mandeville
(74) *Attorney, Agent, or Firm* — Innovation Counsel LLP

(57) ABSTRACT

An organic light emitting display device includes a light emitting layer for emitting light and for displaying an image, a fingerprint sensor for detecting a fingerprint, and a circuit element layer disposed between the light emitting layer and the fingerprint sensor and configured to control the light emitting layer. The fingerprint sensor includes a light receiver. The light receiver overlaps the light emitting layer and has an uneven surface.

19 Claims, 5 Drawing Sheets

ORGANIC LIGHT EMITTING DISPLAY DEVICE

CROSS REFERENCE TO RELATED APPLICATION

This application claims priority to and the benefit of Korean Patent Application No. 10-2018-0121396, filed on Oct. 11, 2018 in the Korean Intellectual Property Office (KIPO); the disclosure of the Korean Patent Application is incorporated by reference in its entirety.

BACKGROUND

1. Field

The technical field relates to display devices. More particularly, the technical field relates to organic light emitting display devices.

2. Discussion of Related Art

Display devices may be included in electronic devices such as smart terminals, mobile phones, monitors, TVs, etc. Sensing functions, such as biometric sensing functions, may be implemented in the display devices and/or the electronic devices.

SUMMARY

Example embodiments may be related to an organic light emitting display device including a light receiver having uneven surface.

According to example embodiments, an organic light emitting display device may comprise a light emitting layer emitting light and displaying an image; a fingerprint sensor including a light receiver having an uneven surface and detecting a fingerprint by a photo sensing method; and a circuit element layer disposed between the light emitting layer and the fingerprint sensor to control the light emitting layer.

In example embodiments, the organic light emitting display device may further comprise a slit pattern layer disposed between the fingerprint sensor and the circuit element layer to provide a light path by concentrating the light directed to the fingerprint sensor.

In example embodiments, the slit pattern layer may include an inorganic material.

In example embodiments, the fingerprint sensor may include a photodiode configured to detect reflected light which is emitted from the light emitting element layer and reflected from the fingerprint, the photodiode including the light receiver; and a transistor connected to the photodiode.

In example embodiments, the photodiode may include a semiconductor layer provided on a substrate, the semiconductor layer including an uneven upper surface; a conductive layer provided on the semiconductor layer, the conductive layer including an uneven portion corresponding to the uneven upper surface of the semiconductor layer; and a protection layer provided on the substrate to cover the semiconductor layer and the conductive layer.

In example embodiments, the photodiode may further include a bias electrode provided on the protection layer and connected to the conductive layer via the protection layer.

In example embodiments, the uneven portion may be a form in which a plurality of pyramids is arranged.

In example embodiments, the conductive layer may include a transparent conductive material.

In example embodiments, the photodiode may further include an anti-reflection layer provided on the conductive layer.

In example embodiments, the anti-reflection may include at least one inorganic layer disposed along the uneven portion of the conductive layer.

In example embodiments, the anti-reflection layer may include a silicon nitride layer disposed on the conductive layer along the uneven portion; and a silicon oxide layer disposed on the silicon nitride along an uneven surface of the silicon nitride layer.

In example embodiments, the transistor may include an active pattern provided on the substrate; a gate insulating layer provided on the active pattern; a gate electrode provided on the gate insulating layer; an insulating interlayer provided on the gate electrode; and source and drain electrode provided on the insulating interlayer and connected to the active pattern via gate insulating layer and the insulating interlayer.

In example embodiments, the semiconductor layer may be disposed on the drain electrode of the transistor.

In example embodiments, the semiconductor layer of the photodiode may include an amorphous silicon semiconductor, and the active pattern of the transistor may include a polysilicon semiconductor.

In example embodiments, the light emitting layer may include a first electrode connected to the circuit element layer; a light emitting layer provided on the first electrode; and a second electrode provided on the light emitting layer.

In example embodiments, the organic light emitting display device may further comprise a touch sensor provided on the light emitting element layer to detect a touch.

According to example embodiments, an organic light emitting display device may comprise a photodiode including a light receiver having an uneven upper surface and detecting a reflected light reflected from a fingerprint; a transistor connected to the photodiode; a slit pattern layer disposed on the photodiode and the transistor, the slit pattern layer providing a light path by concentrating the light directed to the fingerprint sensor; a circuit element layer disposed on the slit pattern layer; and a light emitting element layer disposed on the circuit element layer, the light emitting layer displaying an image by controlling the circuit element layer.

In example embodiments, the photodiode may include a semiconductor layer provided on a substrate, the semiconductor layer including an uneven upper surface; a conductive layer provided on the semiconductor layer, the conductive layer including an uneven portion corresponding to the uneven upper surface of the semiconductor layer; and a protection layer provided on the substrate to cover the semiconductor layer and the conductive layer.

In example embodiments, the uneven upper surface of the semiconductor layer may be formed by alkaline etching or plasma etching.

In example embodiments, the photodiode may further include at least one inorganic layer disposed on the conductive layer along the uneven portion of the conductive layer.

An embodiment may be related to an organic light emitting display device. The organic light emitting display device may include a light emitting layer for emitting light and for displaying an image, a fingerprint sensor for detecting a fingerprint, and a circuit element layer disposed between the light emitting layer and the fingerprint sensor and configured to control the light emitting layer. The fingerprint sensor may include a light receiver. The light receiver may overlap the light emitting layer and may have an uneven surface (for receiving and reflecting light).

The organic light emitting display device may include a slit pattern layer disposed between the fingerprint sensor and the circuit element layer for concentrating light directed to the fingerprint sensor.

The slit pattern layer may include an inorganic material.

The fingerprint sensor may include a photodiode configured to detect reflected light that is emitted from the light emitting element layer and reflected from at least one of the fingerprint and a finger associated with the fingerprint, the photodiode including the light receiver. The fingerprint sensor may include a transistor connected to the photodiode.

The photodiode may include the following elements: a semiconductor layer including an uneven corresponding surface; a conductive layer provided on the semiconductor layer, the conductive layer including an uneven portion corresponding to the uneven corresponding surface of the semiconductor layer; and a protection layer covering the semiconductor layer and the conductive layer.

The photodiode may include a bias electrode provided on the protection layer and connected to the conductive layer via a hole in the protection layer.

The uneven portion may include a plurality of pyramid structures.

The conductive layer may include and/or may be formed of a transparent conductive material.

The photodiode may include an anti-reflection layer provided directly on the conductive layer.

The anti-reflection may include at least one inorganic layer disposed directly on the uneven portion of the conductive layer.

The anti-reflection layer may include the following layers: a silicon nitride layer disposed directly on the uneven portion of the conductive layer; and a silicon oxide layer disposed directly on an uneven surface of the silicon nitride layer.

The transistor may include the following elements: an active member; a gate insulating layer provided on the active member; a gate electrode provided on the gate insulating layer; an insulating interlayer provided on the gate electrode; and a source electrode and a drain electrode provided on the insulating interlayer and connected to the active member via contact holes in the gate insulating layer and the insulating interlayer.

The semiconductor layer may be disposed on the drain electrode of the transistor.

The semiconductor layer of the photodiode may include an amorphous silicon semiconductor. The active member of the transistor may include a polysilicon semiconductor.

The light emitting layer may include the following elements: a first electrode electrically connected to the circuit element layer; a light emitting layer provided on the first electrode; and a second electrode provided on the light emitting layer.

The organic light emitting display device may include a touch sensor provided on the light emitting element layer to detect a touch.

An embodiment may be related to an organic light emitting display device. The organic light emitting display device may include the following elements: a photodiode including a light receiver for detecting reflected light reflected from at least one of a fingerprint and a finger associated with the fingerprint, wherein the light receiver may have an uneven surface; a transistor electrically connected to the photodiode; a slit pattern layer overlapping both the photodiode and the transistor for concentrating light directed to the light receiver; a circuit element layer disposed on the slit pattern layer; and a light emitting element layer disposed on the circuit element layer for displaying an image, the light emitting element layer being controlled by the circuit element layer.

The photodiode may include the following elements: a semiconductor layer including an uneven corresponding surface; a conductive layer provided on the semiconductor layer, the conductive layer including an uneven portion corresponding to the uneven corresponding surface of the semiconductor layer; and a protection layer provided covering the semiconductor layer and the conductive layer.

The photodiode may include at least one inorganic layer disposed directly on the uneven portion of the conductive layer.

An embodiment may be related to a method for manufacturing an organic light emitting display device. The method may include the following steps: providing a photodiode that may include a light receiver for detecting a reflected light reflected from at least one of a fingerprint and a finger associated with the fingerprint, wherein the light receiver may have an uneven surface, and wherein the uneven surface may be formed through alkaline etching or plasma etching; providing a transistor that may be electrically connected to the photodiode; providing a slit pattern layer that may overlap both the photodiode and the transistor for concentrating light directed to the light receiver; providing a circuit element layer on the slit pattern layer; and providing a light emitting element layer on the circuit element layer for displaying an image.

DETAILED DESCRIPTION OF EMBODIMENTS

Exemplary embodiments are described with reference to the accompanying drawings. Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. The term "pattern" may mean "member"; the term "connect" may mean "electrically connect"; the term "fingerprint" may mean "pattern/lines of a finger."

Figure 1:
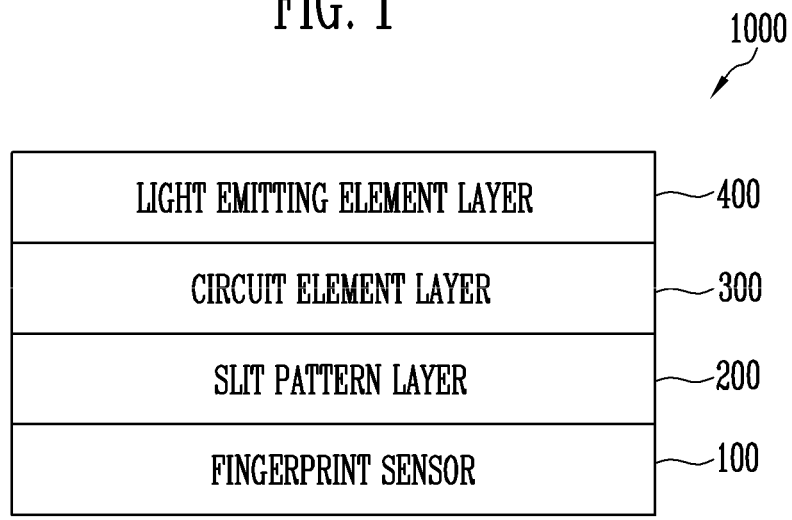
FIG. 1 is a diagram illustrating layers of an organic light emitting display device according to example embodiments.

FIG. 1 is a diagram illustrating layers of an organic light emitting display device according to example embodiments.

Referring to FIG. 1, the organic light emitting display device 1000 may include a fingerprint sensor 100, a slit pattern layer 200, a circuit element layer 300, and a light emitting element layer 400.

In some embodiments, the fingerprint sensor 100 may be an optical sensor that detects a fingerprint by/using an optical sensing method. The optical sensing type fingerprint sensor 100 may be replaced with or supplemented with a different biometric information sensor, such as one or more of an iris recognition sensor, an arterial sensor, etc.

The fingerprint sensor 100 may detect reflected light that is emitted from the light emitting element layer 400 and reflected by a fingerprint. The fingerprint sensor 100 may include a light receiver having an uneven surface (e.g., a surface including concave and/or convex portions). The light receiver may receive the light reflected from the fingerprint. The uneven surface of the light receiver may advantageously increase the amount of received light.

In some embodiments, the fingerprint sensor 100 may include a photodiode including the light receiver and a switching element (e.g., a thin film transistor) connected to the photodiode. Alternatively or additionally, the light receiver of the fingerprint sensor 100 may include a phototransistor, a photomultiplier, or the like.

In some embodiments, the slit pattern layer 200 may be disposed on the fingerprint sensor 100. The slit pattern layer 200 may be disposed between the fingerprint sensor 100 and the circuit element layer 300. The slit pattern layer 200 may concentrate the light from the circuit element layer 300 to the fingerprint sensor 100. One or more widths of slits of the slit pattern layer 200 may be determined in consideration of the sensing accuracy and light conversion efficiency. The light concentrating rate of the light incident on the light receiver of the fingerprint sensor 200 may be improved by the slit pattern layer 200.

In some embodiments, the slit pattern layer 200 may be formed of an inorganic material. For example, the slit pattern layer 200 may be formed of silicon, an optical fiber, or the like.

In one embodiment, the slit pattern layer 200 may be deposited directly onto the fingerprint sensor 100. In another embodiment, the slit pattern layer 200 and the fingerprint sensor 100 may be adhered to each other by a transparent adhesive material.

The circuit element layer 300 may be disposed on the slit pattern layer 200. The circuit element layer 300 can control the light emitting element layer 400. In some embodiments, circuit element layer 300 may include at least one transistor and at least one capacitor.

The light emitting element layer 400 may be disposed on the circuit element layer 300. The light emitting element layer 400 may emit light to display an image. In some embodiments, the light emitting element layer 400 may include an organic light emitting diode that is a self-light emitting element. For example, the light emitting element layer 400 may include an anode electrode, a cathode electrode, and an organic light emitting layer between the anode electrode and the cathode electrode.

The light emitted from the light emitting element layer 400 may be reflected by the fingerprint and may be incident on the fingerprint sensor 100. Since the light receiver of the fingerprint sensor 100 detects the reflected light, it is important to maximize the light receiving efficiency of the light receiver in order to improve the sensitivity of the fingerprint sensor 100.

In some embodiments, a touch sensor may be disposed on the light emitting element layer 400 to detect a touch.

Figure 2:
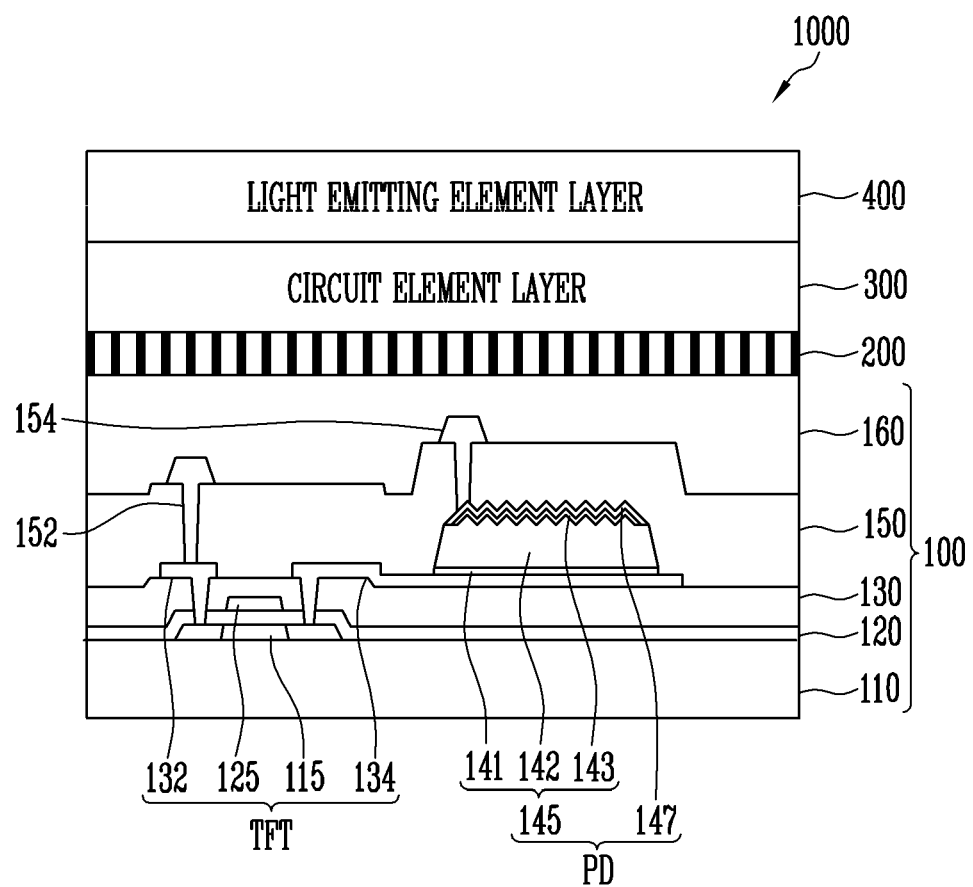
FIG. 2 is a diagram (e.g., a cross-sectional view) illustrating a fingerprint sensor included in the organic light emitting display device of FIG. 1 according to example embodiments.

FIG. 2 is a diagram (e.g., a cross-sectional view) illustrating a fingerprint sensor included in the organic light emitting display device of FIG. 11 according to example embodiments.

Referring to FIG. 2, the organic light emitting display device 1000 may include a fingerprint sensor 100, a slit pattern layer 200, a circuit element layer 300, and a light emitting element layer 400.

In some embodiments, the fingerprint sensor 100 may include a plurality of photodiodes PD and a plurality of transistors TFT respectively connected to the photodiodes PD.

The photodiode PD may include a light receiver (a light receiving portion) and may detect reflected light that is emitted from the light emitting element layer 400 and reflected from the fingerprint.

In FIG. 2, one transistor and one photodiode are shown for convenience of explanation. The photodiode PD may be connected to two or more transistors. The fingerprint sensor 100 including the photodiode PD and the transistor TFT may be provided on a substrate 110 and/or may include a portion of the substrate 110.

The substrate 110 may be made of an insulating material such as glass, resin, or the like. The substrate 110 may be made of a material having flexibility so as to be bent or folded. The substrate 100 may have a single-layer structure or a multi-layer structure.

A buffer layer may be formed on the substrate 110. The buffer layer may prevent impurities from diffusing into switching transistors and driving transistors. The buffer layer may be unnecessary depending on the material of the substrate 110 and the processing conditions.

An active pattern 115 (or active member 115) may be provided on the buffer layer. The active pattern 115 may be formed of a semiconductor material. The active pattern 115 may include a source region, a drain region, and a channel region provided between the source region and the drain region.

A gate insulating layer 120 may be provided on the active pattern 115. The gate insulating layer 120 may be an inorganic insulating layer made of an inorganic material.

A gate electrode 125 may be provided on the gate insulating layer 120. The gate electrode 125 may be formed so as to cover an area corresponding to the channel region of the active pattern 115. The gate electrode 125 may be formed of a metal. For example, the gate electrode 125 may be formed of at least one of gold (Au), silver (Ag), aluminum (Al), molybdenum (Mo), chromium (Cr), titanium (Ti), nickel (Ni), neodymium (Nd), Copper (Cu), and an alloy of some of the metals. The gate electrode 125 may be formed as a single layer or multiple layers in which two or more meal/alloy materials are stacked.

An insulating interlayer 130 may be provided on the gate electrode 125. The insulating interlayer 130 may be an inorganic insulating layer made of an inorganic material, such as at least one of polysiloxane, silicon nitride, silicon oxide, and silicon oxynitride.

A source electrode 132 and a drain electrode 134 may be provided on the insulating interlayer 130. The source electrode 132 and the drain electrode 134 may contact the source region and the drain region of the active pattern 115 via contact holes formed in the insulating interlayer 130 and the gate insulating layer 120.

The source electrode 132 and the drain electrode 134 may be made of metal. For example, the source electrode 132 and the drain electrode 134 may be formed of at least one of Au, Ag, Al, Mo, Cr, Ti, Ni, Nd, Cu, and an alloy of some of the metals.

A protection layer 150 may be provided on the source electrode 132 and the drain electrode 134. The protection layer 150 may be an inorganic insulating layer made of an inorganic material, such as at least one of polysiloxane, silicon nitride, silicon oxide, and silicon oxynitride.

The active pattern 115, the gate electrode 125, the source electrode 132, and the drain electrode 134 may constitute the transistor TFT.

In some embodiments, the photodiode PD may include a semiconductor layer 145, a conductive layer 147, and the protection layer 150.

The semiconductor layer 145 may be provided on the substrate 110. In some embodiments, the semiconductor layer 145 may be disposed on the drain electrode 134 of the transistor TFT. In some embodiments, the semiconductor layer 145 may include an amorphous silicon semiconductor, and the active pattern 115 of the transistor TFT may include a polysilicon semiconductor. The transistor TFT may realize a high response speed.

The semiconductor layer 145 may include doped regions 141 and 143 and may include a channel region 142 between the doped regions 141 and 143. For example, a lower doped region 141 may be an n-doped region, and an upper doped region 143 may be a p-doped region. The types of doped regions can be reversed in embodiments.

An upper surface of the semiconductor layer 145 may have an uneven structure. In some embodiments, the uneven portion may include a plurality of pyramid structures. Alternatively or additionally, the uneven portions may include a plurality of concave portions and/or convex portions having other structures.

In some embodiments, the channel region 142 and the upper doped region 143 may have the uneven portion. In some embodiments, only the upper doped region 143 may have the uneven portion.

In some embodiments, the uneven portion of the semiconductor layer 145 may be formed by/through alkaline etching. The uneven portion (uneven surface) of the semiconductor layer 145 may be formed by/through chemical etching. For example, the upper surface of the amorphous silicon may be selectively etched by an alkaline solution such as sodium hydroxide (NaOH), potassium hydroxide (KOH), or the like.

In some embodiments, the uneven portion of the semiconductor layer 145 may be formed by plasma/through etching. For example, the uneven portion may be formed by reactive ion etching (RIE), microwave plasma etching, or the like.

Since the atomic density of the semiconductor layer 145 (for example, amorphous silicon) itself is not uniform, and thus etch-rates may differ depending on regions; as a result, pyramidal or convex irregularities and/or structures may be formed.

The conductive layer 147 may be disposed on the semiconductor layer 145. The conductive layer 147 may have an uneven portion directly contacting the uneven upper surface of the semiconductor layer 145. In some embodiments, the conductive layer 147 may include a transparent conductive material. For example, the conductive layer 147 may be formed of ITO (indium tin oxide), IZO (indium zinc oxide), ZnO (zinc oxide), ITZO (indium tin zinc oxide), or the like.

The protection layer 150 may cover the semiconductor layer 145 and the conductive layer 147. The protection layer 150 may include silicon nitride, silicon oxide, silicon oxynitride, or the like; therefore, the protection layer 150 may not significantly affect the photoelectric conversion of the photodiode PD. The protection layer 150 may block, absorb, or filter ultraviolet rays or the like that may lower the stability of the photodiode PD.

In some embodiments, the photodiode PD may further include a bias electrode 154. The bias electrode 154 may be connected to the conductive layer 147 via a contact hole passing through the passivation layer 150.

A predetermined voltage for driving the photodiode PD may be supplied to the photodiode PD through the bias electrode 154. The bias electrode 154 may be formed of at least one of Au, Ag, Al, Mo, Cr, Ti, Ni, Ne, and an alloy of some of the metals.

A connection electrode 152 connected to the source electrode 132 of the transistor TFT may be further disposed on the protection layer 150. The connection electrode 152 may be connected to the source electrode 132 through a contact hole passing through the protection layer 150. The connection electrode 152 may be electrically connected to a driver or the like for driving the fingerprint sensor 100.

A planarization layer 160 covering the bias electrode 154 and the connection electrode 152 may be disposed on the protection layer 150. The planarization layer 160 may be an organic insulating layer made of an organic material, such as a polyacrylic compound, a polyimide compound, a benzocyclobutene compound, or a fluorocarbon compound such as Teflon.

In some embodiments, a slit pattern layer 200 including an inorganic material may be disposed on the planarization layer 160.

In the light receiver of the photodiode PD, since the upper surface of the semiconductor layer 145 and the conductive layer 147 on the semiconductor layer 145 may have uneven portions (e.g., portions including concave-convex structures), the reflectance of light incident on the light receiver may be reduced, and the light absorption path may extend. Advantageously, the amount of received light may be increased.

Figure 3A:
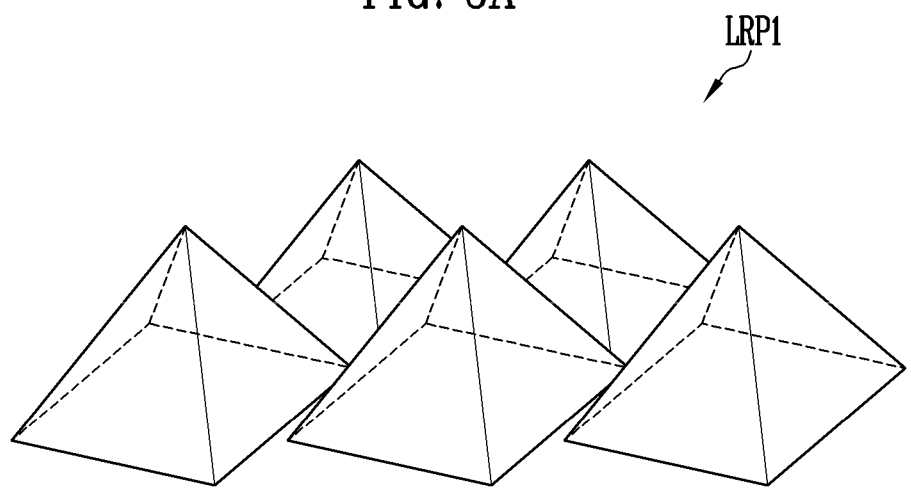
FIG. 3A is a perspective view illustrating structures of a light receiver included in the fingerprint sensor of FIG. 2 according to example embodiments.
Figure 3B:
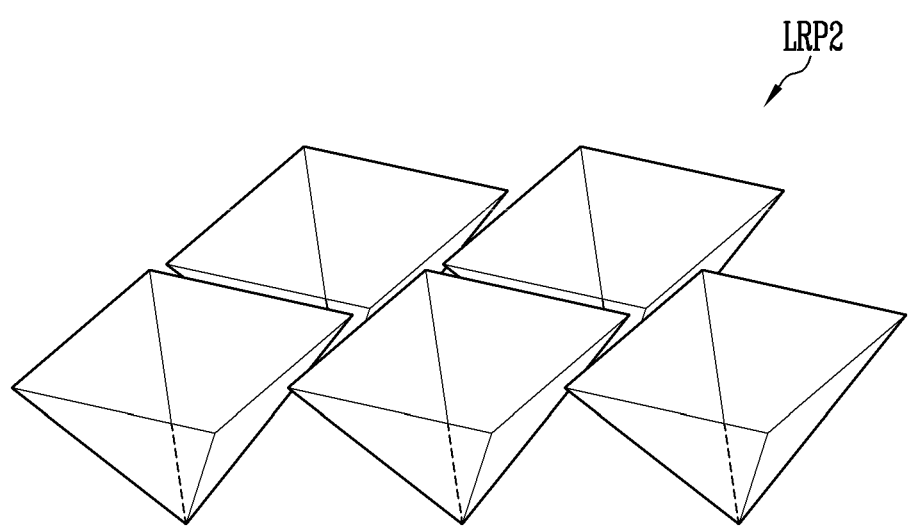
FIG. 3B is a perspective view illustrating structures of a light receiver included in the fingerprint sensor of FIG. 2 according to example embodiments.

FIGS. 3A and 3B are perspective views illustrating structures of a light receiver included in the fingerprint sensor of FIG. 2 according to example embodiments.

Referring to FIGS. 2 to 3B, the light receiver LRP1 and/or LRP2 of the fingerprint sensor 100 may be formed on an upper surface of the photodiode PD. The light receiver LRP1 and/or LRP2 may include parts of a channel region 142, parts of a doped region 143, parts of a conductive layer 147, and/or parts of an anti-reflection layer 148 (illustrated in FIG. 4A and/or FIG. 4B).

The light receiver LRP1 and/or LRP2 may have an uneven light receiving surface, so that light reflection in the photodiode PD can be minimized. For example, the upper surface of the semiconductor layer 145 of the photodiode PD may have the uneven structure.

In some embodiments, as shown in FIG. 3A, the light receiver LRP1 and/or the upper surface of the semiconductor layer 145 of the photodiode PD may have a plurality of pyramid structures. The size, height, and area of the pyramid structures may not be uniform. Light incident on the light receiver LRP1 may be reflected between the pyramid surfaces so that the light absorption path extends. As a result, light reflected out of the light receiver structures LRP1 may be reduced.

In some embodiments, as shown in FIG. 3B, the light receiver LRP2 of the semiconductor layer 145 and/or of the conductive layer 147 may have inverted pyramid structures. Advantageously, the light absorption path may be further extended, and the light receiving amount may be increased.

In some embodiments, the light receiver LRP1 and/or LRP2 may be formed by/through alkali etching, plasma etching, or the like. The uneven surface structures such as the pyramid structures, may be formed based on non-uniform etch rates due to non-uniform atom densities of amorphous silicon.

Figure 4A:
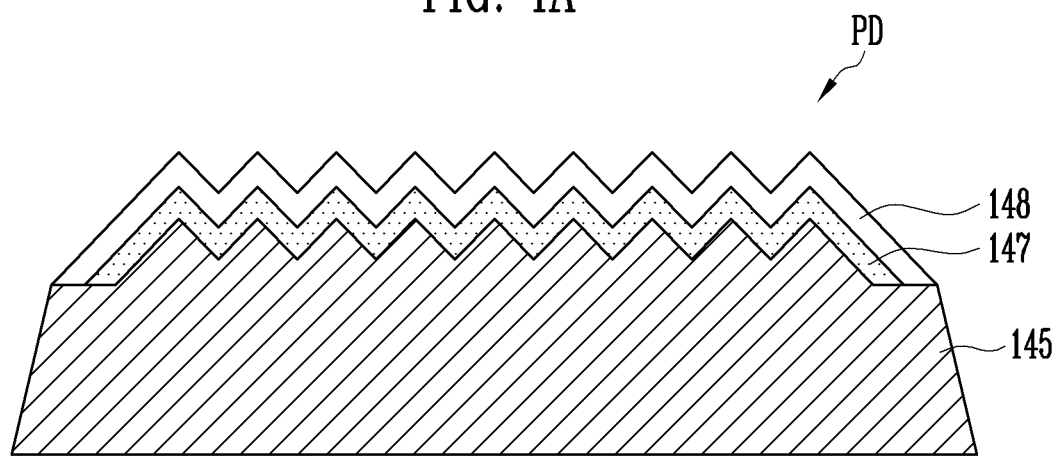
FIG. 4A is a cross-sectional view illustrating light receiver structures of a photodiode included in the fingerprint sensor of FIG. 2 according to example embodiments.
Figure 4B:
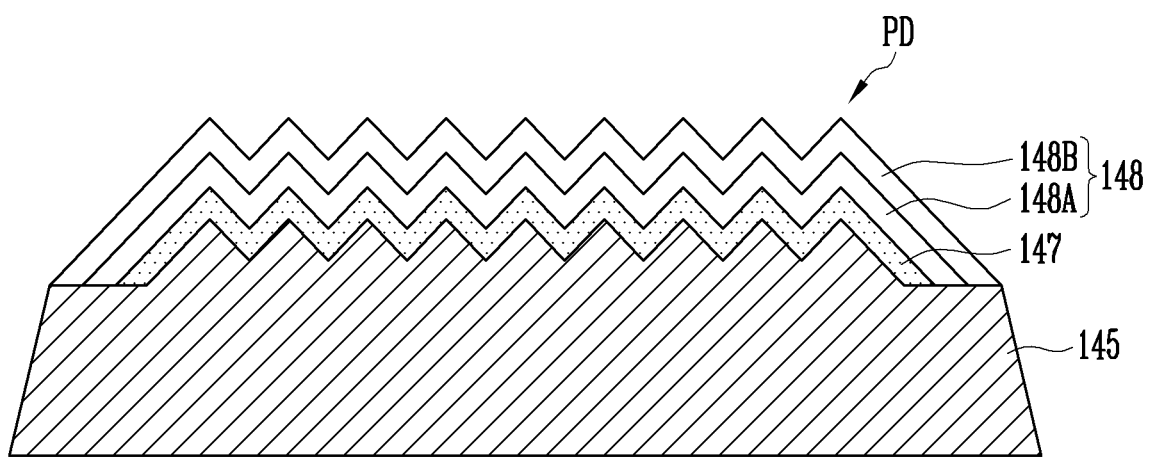
FIG. 4B is a cross-sectional view illustrating light receiver structures of a photodiode included in the fingerprint sensor of FIG. 2 according to example embodiments.

FIGS. 4A and 4B are cross-sectional views illustrating light receiver structures of a photodiode included in the fingerprint sensor of FIG. 2 according to example embodiments.

Referring to FIGS. 2 to 4B, the fingerprint sensor 100 may include the photodiode PD. The photodiode PD may include the semiconductor layer 145, the conductive layer 147, and an anti-reflection layer 148. Parts of the semiconductor layer 145, parts of the conductive layer 147, and/or parts of the anti-reflection layer 148 may constitute the light receiver LRP1 and/or LRP2.

The upper surface of the semiconductor layer 145 may be/include an uneven upper surface. The conductive layer 147 may be disposed on the semiconductor layer 145 and may directly contact and match the uneven upper surface of the semiconductor layer 145.

The anti-reflection layer 148 may be disposed on the conductive layer 147 and may directly contact and match the uneven surface of the conductive layer 147. The anti-reflection layer 148 may be formed of an inorganic material. For example, the anti-reflective layer 148 may include silicon nitride, silicon oxide, or the like. The anti-reflective layer 148 may cause destructive interference for a specific wavelength incident on the photodiode PD depending on its thickness. Therefore, the light absorption in a specific wavelength range may be maximized, and the reflectance of the photodiode PD may be further reduced.

In some embodiments, as shown in FIG. 4B, the anti-reflective layer 148 may include a plurality of anti-reflective layers 148A and 148B. The first antireflection layer 148A may be disposed on the conductive layer 147 and may directly contact and match the uneven surface. The first anti-reflection layer 148A may be a silicon nitride layer. The second anti-reflection layer 148B may be disposed on the first anti-reflection layer 148A and may directly contact and match an uneven surface of the first anti-reflection layer 148A. For example, the second antireflection layer 148B may be a silicon oxide layer. The first and second anti-reflection layers 148A and 148B may have additional or alternative structures and/or material. The number of inorganic layers included in the antireflection layer 148 may be greater than 2.

When the anti-reflection layer 148 includes a plurality of inorganic layers, the absorptivity for a plurality of wavelength ranges may increase. Accordingly, the light reflectance of the light receiver can be further reduced and the light absorptivity can be improved. Therefore, the sensing sensitivity of the fingerprint sensor 100 may be improved.

Figure 5:
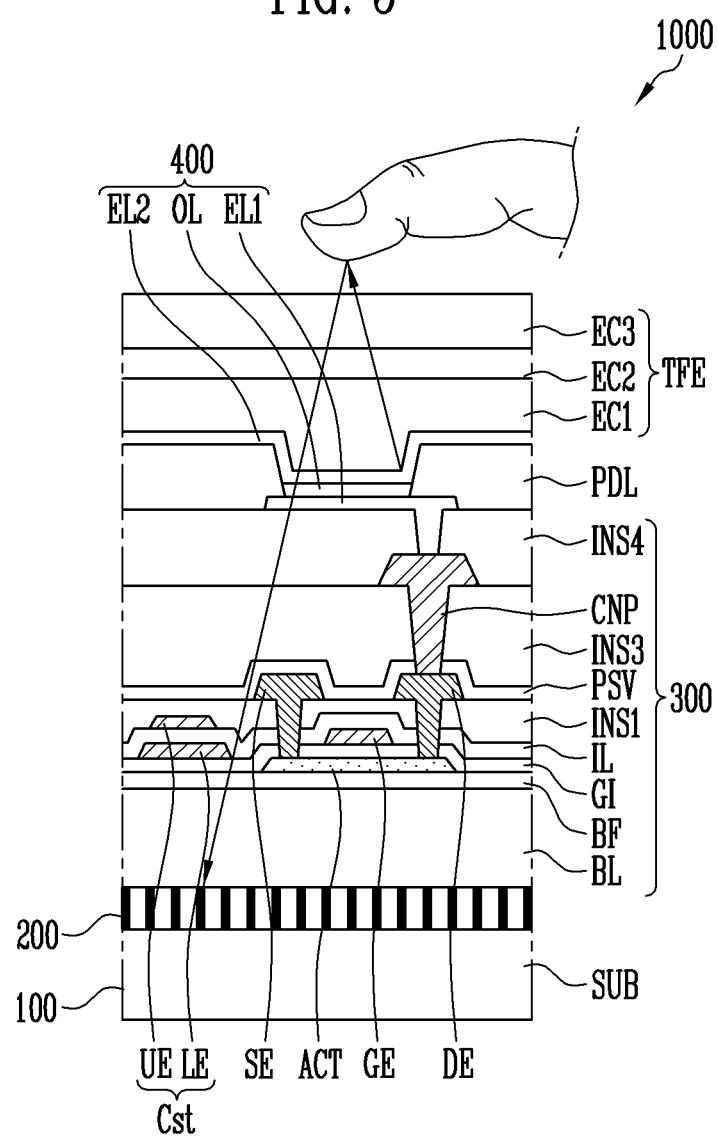
FIG. 5 is a cross-sectional view illustrating a light emitting element layer and a circuit element layer included in the organic light emitting display device of FIG. 1.

FIG. 5 is a cross-sectional view illustrating a light emitting element layer and a circuit element layer included in the organic light emitting display device of FIG. 1 according to example embodiments.

Referring to FIGS. 1 to 5, a portion of the circuit element layer 300 and a portion of the light emitting element layer 400 may constitute a pixel for displaying an image.

The organic light emitting display device 1000 may include a plurality of pixel each including a light emitting element and a pixel circuit.

The pixel may include a transistor connected to a predetermined conductive line, a light emitting element connected to the transistor, and a capacitor Cst.

In some embodiments, the transistor and the capacitor Cst may be formed in the circuit element layer 300, and the light emitting element may be formed in the light emitting element layer 400. The transistor may include a driving transistor for controlling the light emitting element, and a switching transistor for controlling the driving transistor.

In FIG. 5, one transistor and one capacitor in one pixel for convenience of explanation. The pixel may include two or more transistors and at least one capacitor. The pixel may be provided on a base layer BL.

The base layer BL may be made of an insulating material such as glass, resin, or the like. The base layer BL may be made of a material having flexibility so as to be bent or folded. The base layer BL may have a single-layer structure or a multi-layer structure.

In some embodiments, the base layer BL may be disposed on the slit pattern layer 200. For example, the base layer BL may be disposed directly on the slit pattern layer 200 or may be adhered to the slit pattern layer 200 by a transparent adhesive material.

In some embodiments, the base layer BL may be unnecessary, and the slit pattern layer 200 may perform functions of the base layer BL.

A buffer layer BF may be formed on the base layer BL. The buffer layer BF can prevent impurities from diffusing into the switching and driving transistors. The buffer layer BF may be an inorganic insulating layer made of an inorganic material. For example, the buffer layer BF may be formed of silicon nitride, silicon oxide, silicon oxynitride or the like. The buffer layer BF may be unnecessary depending on the material of the base layer BL and the process conditions.

An active pattern ACT is provided on the buffer layer BF. The active pattern ACT is formed of a semiconductor material. The active pattern ACT may include a source region, a drain region, and a channel region between the source region and the drain region. The active pattern ACT may be a semiconductor pattern made of polysilicon, amorphous silicon, oxide semiconductor, or the like.

A gate insulating layer GI is provided on the active pattern ACT. The gate insulating layer GI may be an inorganic insulating layer made of an inorganic material.

A gate electrode GE and a capacitor lower electrode LE may be provided on the gate insulating layer GI. The gate electrode GE may be formed so as to cover an area corresponding to the channel region of the active pattern ACT.

The gate electrode GE and the capacitor lower electrode LE may be made of metal. For example, the gate electrode GE may be formed of a metal such as Au, Ag, Al, Mo, Cr, Ti, Ni, Nd, Cu, or an alloy of metals. Further, the gate electrode GE may be formed as a single layer or multiple layers in which two or more metals and/or alloys are stacked.

An insulating interlayer IL may be provided on the gate electrode GE and the capacitor lower electrode LE. The insulating interlayer IL may be an inorganic insulating layer made of an inorganic material. As the inorganic material, polysiloxane, silicon nitride, silicon oxide, silicon oxynitride and the like can be used.

A capacitor upper electrode UE may be provided on the insulating interlayer IL. The capacitor upper electrode UE may be made of metal. For example, the capacitor upper electrode UE may be formed of a material selected of Au, Ag, Al, Mo, Cr, Ti, Ni, Nd, Cu, or an alloy of metals. In addition, the capacitor upper electrode UE may be formed as a single layer, but not limited thereto, and may be formed as a multilayer in which two or more metals and/or alloys are stacked.

The capacitor lower electrode LE and the capacitor upper electrode UE may form the capacitor Cst with the insulating interlayer IL interposed between the capacitor lower electrode LE and the capacitor upper electrode UE.

A first insulating layer INS1 may be provided on the capacitor upper electrode UE. The first insulating layer INS1 may be an inorganic insulating layer made of an inorganic material. As the inorganic material, polysiloxane, silicon nitride, silicon oxide, silicon oxynitride and the like can be used.

A source electrode SE and a drain electrode DE are provided on the first insulating layer INS1. The source electrode SE and the drain electrode DE are electrically connected to the source region and the drain region of the active pattern ACT through the contact holes formed in the first insulating layer INS1, the insulating interlayer IL and the gate insulating layer GI.

The source electrode SE and the drain electrode DE may be made of metal. For example, the source electrode SE and the drain electrode DE may be formed of a metal such as Au, Ag, Al, Mo, Cr, Ti, Ni, Nd, Cu, or an alloy of some of the metals.

A passivation layer PSV (e.g., a second insulating layer) may be provided on the source electrode SE and the drain electrode DE. The passivation layer PSV may be an inorganic insulating layer made of an inorganic material. As the inorganic material, polysiloxane, silicon nitride, silicon oxide, silicon oxynitride and the like can be used.

A third insulating layer INS3 may be provided on the passivation layer PSV. The third insulating layer INS3 may be an organic insulating layer made of an organic material, such as a polyacrylic compound, a polyimide compound, a benzocyclobutene compound, or a fluorocarbon compound such as Teflon.

A connection pattern CNP (or connection member CNP) may be provided on the third insulating layer INS3. The connection pattern CNP may be connected to the drain electrode DE of the transistor through the contact hole passing through the third insulating layer INS3 and the passivation layer PSV. The connection pattern CNP may be formed of Au, Ag, Al, Mo, Cr, Ti, Ni, Nd, Cu, or an alloy of some of the metals.

A fourth insulating layer INS4 may be provided on the connection pattern CNP. The fourth insulating layer INS4 may be an organic insulating layer made of an organic material, such as a polyacrylic compound, a polyimide compound, a benzocyclobutene compound, or a fluorocarbon compound such as Teflon.

A first electrode EL1 may be provided on the fourth insulating layer INS4. The first electrode EL1 may be connected to the connection pattern CNP through a contact hole passing through the fourth insulation layer INS4. The first electrode EL1 may be used as one of an anode electrode and a cathode electrode.

In FIG. 5, the passivation layer PSV, the third insulating layer INS3, and the fourth insulating layer INS4 are provided on the drain electrode DE. In embodiments, the passivation layer PSV may be provided on the drain electrode DE, and the first electrode EL1 may be provided on the passivation layer PSV. In embodiments, the passivation layer PSV and the third insulating layer INS3 may be provided, and the first electrode EL1 may be provided on the third insulating layer INS3. In embodiments, the connection pattern CNP may be unnecessary, and the first electrode EL1 may be directly connected to the drain electrode DE.

The first electrode EL1 may include least one of Ag, Mg, Al, Pt, Pd, Au, Ni, Ir, Cr, ITO (indium tin oxide), IZO (indium zinc oxide), Zinc oxide (ZnO), indium tin zinc oxide (ITZO), and an alloy of some of the metals.

A pixel defining layer PDL may overlap the base layer BL and may substantially expose the first electrode EL1 is formed, for defining a pixel area corresponding to a pixel. The pixel defining layer PDL may be an organic insulating layer made of an organic material, such as a polyacrylic compound, a polyimide compound, a benzocyclobutene compound, or a fluorocarbon compound such as Teflon.

The pixel defining layer PDL exposes an upper surface of the first electrode EL1 and protrudes with reference to the base layer BL along a periphery of the pixel.

The light emitting layer OL may be provided in the pixel area surrounded by the pixel defining layer PDL. The light emitting layer OL may be a single layer or may include multiple functional layers. In some embodiments, the light emitting layer OL may include an organic light emitting layer. The light emitting layer OL may include a hole injection layer (HIL), a hole transport layer (HTL), an emission layer (EML), an electron transport layer (ETL), and an electron transport layer (ETL), and an electron injection layer (EIL) that are stacked.

A second electrode EL2 may be provided on the light emitting layer OL. The second electrode EL2 may be provided for one pixel or may be shared by a plurality of pixels.

When the first electrode EL1 is an anode electrode, the second electrode EL2 may be a cathode electrode. When the first electrode EL1 is a cathode electrode, the second electrode EL2 may be an anode electrode.

The second electrode EL2 may be formed of a metal such as Ag, Mg, Al, Pt, Pd, Au, Ni, Nd, Ir or Cr and/or a metal oxide layer of indium tin oxide (ITO), indium zinc oxide (IZO) oxide, indium tin zinc oxide (ITZO), or the like. In one embodiment, the second electrode EL2 may include multiple layers including a thin metal layer; for example, the second electrode EL2 may have an ITO-Ag-ITO a triple-layer structure.

An encapsulation layer TFE may be provided on the second electrode EL2. The encapsulation layer TFE may be of a single layer or may include multiple layers. In one embodiment, the encapsulation layer TFE may include a first encapsulation layer EC1, a second encapsulation layer EC2, and a third encapsulation layer EC3. The encapsulation layers EC1 to EC3 may be made of at least an organic material and/or at least an inorganic material. The encapsulation layer EC3 as an uppermost/outermost layer may be made of an inorganic material. In some embodiments, the first encapsulation layer EC1 may be made of the inorganic material, the second encapsulation layer EC2 may be made of an organic material, and the third encapsulation layer EC3 may be made of the/an inorganic material.

The circuit element layer 300 and the light emitting element layer 400 may be disposed on the fingerprint sensor 100. The light emitted from the light emitting element layer 400 may be reflected by the fingerprint, and the reflected light may be incident on the fingerprint sensor 100.

Reflected light from the fingerprint may be incident on the photodiode of the fingerprint sensor 100 through the slit pattern layer 200. The light receiver may have an uneven surface. An anti-reflection layer may be formed on the light receiver. The reflectance of the light receiver may be reduced by the slit pattern layer 200, the uneven surface of the light receiver, and the anti-reflection layer, so that the amount of received light (received by the light receiver) can be increased. Therefore, the sensing sensitivity of the fingerprint sensor 100 included in the organic light emitting display device 1000 may be improved.

Figure 6:
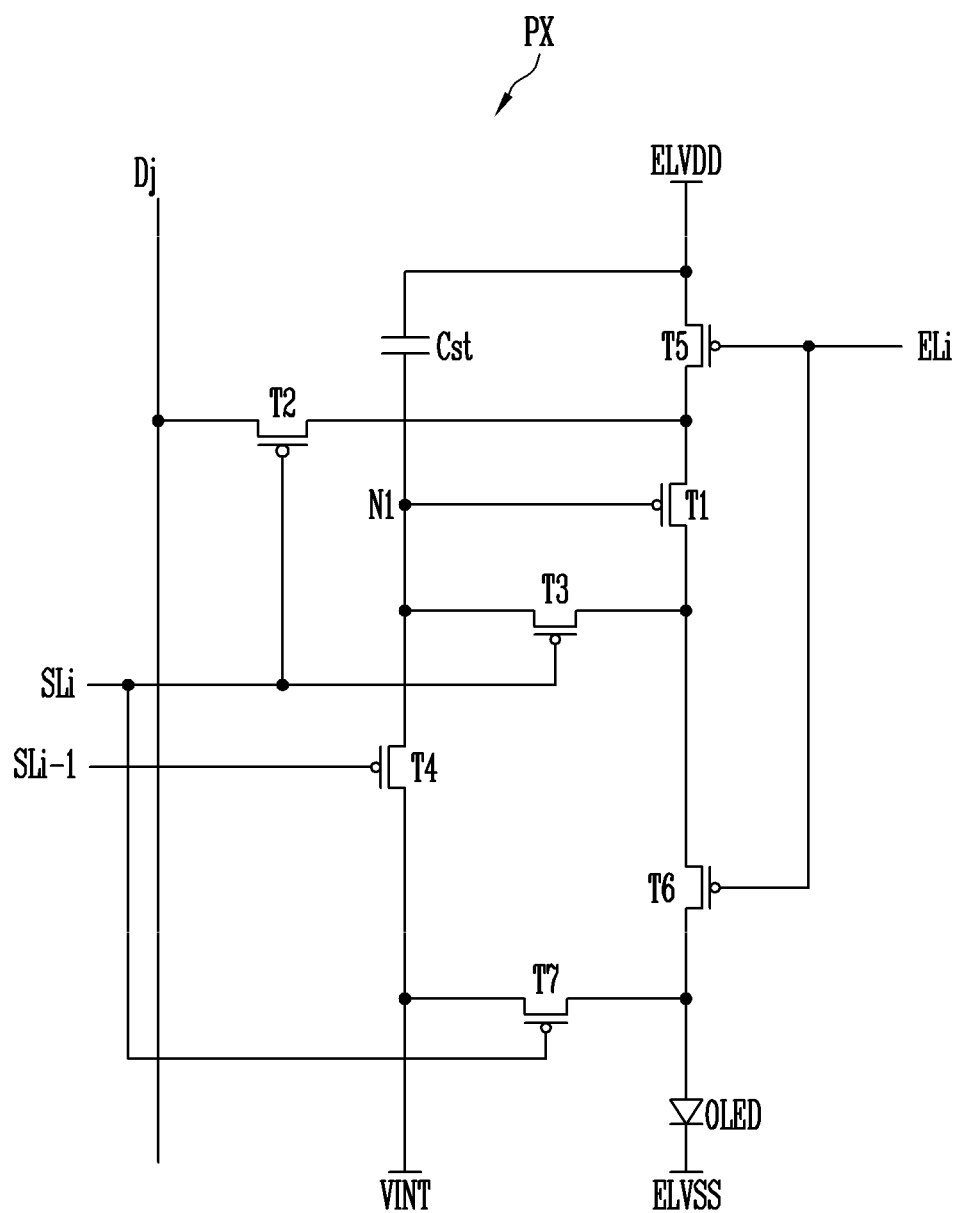
FIG. 6 is a circuit diagram illustrating a pixel included in the organic light emitting display device of FIG. 1 according to example embodiments.

FIG. 6 is a circuit diagram illustrating a pixel included in the organic light emitting display device of FIG. 1 according to example embodiments.

In FIG. 6, A pixel connected to a j-th data line DLj, an i-th scan line SLi, and an i-th emission control line ELi is illustrated, where i and j are natural numbers.

Referring to FIGS. 1 to 6, a pixel PX may include an organic light emitting diode OLED, first to seventh transistors T1 through T7, and a storage capacitor Cst.

An anode electrode of the organic light emitting diode OLED may be connected to the sixth and seventh transistors T6 and T7, and a cathode electrode thereof may be connected to a second power supply voltage ELVSS. The organic light emitting diode OLED may generate light of a predetermined luminance corresponding to an amount of current supplied from a driving transistor (i.e., the first transistor T1).

The seventh transistor T7 may be connected between a third power supply voltage VINT and the anode electrode of the organic light emitting diode OLED. A gate electrode of the seventh transistor T7 may receive a scan signal, e.g., an (i-th scan signal transmitted by the i-th scan line SLi. The seventh transistor T7 may be turned on by the i-th scan signal to supply the third power supply voltage VINT to the anode electrode of the organic light emitting diode OLED.

The sixth transistor T6 may be connected between the first transistor T1 and the organic light emitting diode OLED. A gate electrode of the sixth transistor T6 may receive the i-th emission control signal Ei.

The fifth transistor T5 may be connected between a first power supply voltage ELVDD and the first transistor T1. A gate electrode of the fifth transistor T5 may receive the i-th emission control signal Ei.

The first electrode of the first transistor T1 is connected to the first power source ELVDD via the fifth transistor T5 and the second electrode of the driving transistor is connected to the organic light emitting diode To the anode electrode of the organic light emitting diode (OLED). The gate electrode of the first transistor T1 may be connected to the first node N1. The first transistor T1 may control the amount of current flowing from the first power source ELVDD to the second power source ELVSS via the organic light emitting diode OLED in response to the voltage of the first node N1.

The third transistor T3 may be connected between the second electrode of the first transistor T1 and the first node N1. The gate electrode of the third transistor T3 may receive the i-th scan signal transmitted by the scan line SLi. When the third transistor T3 is turned on, the first transistor T1 may be connected in a diode form, and the threshold voltage compensating operation of the first transistor T1 can be performed.

The fourth transistor T4 may be connected between a first node N1 and the third power supply voltage VINT. A gate electrode of the fourth transistor T4 may receive the (i-1)-th scan signal transmitted by the (i-1)-th scan line SLi-1. The fourth transistor T4 may be turned on in response to the (i-1)-th scan signal to supply the third power supply voltage VINT to the first node N1.

The second transistor T2 may be connected between the data line DLj and the first electrode of the first transistor T1. A gate electrode of the second transistor T2 may receive the i-th scan signal transmitted by the i-th scan line SLi. The second transistor T2 may electrically connect the data line DLj and the first electrode of the first transistor T1 in response to the i-th scan signal.

The storage capacitor Cst may be connected between the first power supply voltage ELVDD and the first node N1. The storage capacitor Cst may store a voltage corresponding to the data signal and the threshold voltage of the first transistor T1.

In embodiments, the gate electrode of the seventh transistor T7 may receive the i-th scan signal or an (i+1)-th scan signal.

Light is emitted from the pixel PX, and the light may be reflected from the fingerprint and incident on the fingerprint sensor 100.

In the organic light emitting display device 1000 according to the embodiments, the light emitted from the light emitting element layer 400 may be reflected by the fingerprint and may be incident on the fingerprint sensor 100.

The reflected light reflected from the fingerprint may be incident on the photodiode PD of the fingerprint sensor 100 through the slit pattern layer 200. The uneven surface (concave and convex structure) of the light receiver LRP1 and/or LRP2 (which may include the anti-reflection layer 148) may reduce the reflectance of the reflected light. Thus, the amount of received light (which is received by the light receiver) can be maximized. Therefore, the sensing sensitivity of the fingerprint sensor 100 included in the organic light emitting display device 1000 may be optimized.

Embodiments may be applied to display devices and systems including display devices. For example, embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The foregoing is illustrative of example embodiments, and is not to be construed as limiting. Although a few example embodiments have been described, those skilled in the art will readily appreciate that many modifications are possible in the example embodiments without materially departing from the novel teachings and advantages of example embodiments. All such modifications are intended to be included within the scope defined in the claims. In the claims, means-plus-function clauses are intended to cover the structures described herein as performing the recited function and not only structural equivalents but also equivalent structures.

What is claimed is:
1. An organic light emitting display device, comprising:
  a light emitting layer for emitting light and for displaying an image;

a fingerprint sensor for detecting a fingerprint, wherein the fingerprint sensor comprises a semiconductor layer and a conductive layer, wherein the conductive layer is positioned between the semiconductor layer and the light emitting layer, and wherein the semiconductor layer comprises a lower doped region, a channel region, and an upper doped region sequentially stacked in a thickness direction, and the channel region has an uneven semiconductor surface, and the upper doped region has an uneven portion corresponding to the uneven semiconductor surface; and a transistor electrically connected to the fingerprint sensor;

a slit pattern layer overlapping both the fingerprint sensor and the transistor for concentrating light directed to the fingerprint sensor;

a circuit element layer disposed on the slit pattern layer between the light emitting layer and the fingerprint sensor and configured to control the light emitting layer, wherein the conductive layer is directly connected to only one bias electrode, and wherein the uneven portion of the upper doped region directly contacts an uneven conductive portion of the conductive layer.

2. The organic light emitting display device of claim 1, wherein the slit pattern layer includes an inorganic material.

3. The organic light emitting display device of claim 1, wherein the transistor electrically connects to the semiconductor layer.

4. The organic light emitting display device of claim 3, wherein the transistor includes:
an active member;
a gate insulating layer provided on the active member;
a gate electrode provided on the gate insulating layer;
an insulating interlayer provided on the gate electrode; and
a source electrode and a drain electrode provided on the insulating interlayer and connected to the active member via contact holes in the gate insulating layer and the insulating interlayer.

5. The organic light emitting display device of claim 4, wherein the semiconductor layer is disposed on the drain electrode of the transistor.

6. The organic light emitting display device of claim 4, wherein the semiconductor layer includes an amorphous silicon semiconductor, and
wherein the active member of the transistor includes a polysilicon semiconductor.

7. The organic light emitting display device of claim 1, further comprising:
a protection layer covering the semiconductor layer and the conductive layer.

8. The organic light emitting display device of claim 7, wherein the bias electrode is provided on the protection layer and is connected to the conductive layer via a hole in the protection layer.

9. The organic light emitting display device of claim 1, wherein the uneven conductive portion of the conductive layer includes a plurality of pyramid structures.

10. The organic light emitting display device of claim 1, wherein the conductive layer includes a transparent conductive material.

11. The organic light emitting display device of claim 1, further comprising:
an anti-reflection layer provided directly on the conductive layer.

12. The organic light emitting display device of claim 11, wherein the anti-reflection layer includes at least one inorganic layer disposed directly on the uneven conductive portion of the conductive layer.

13. The organic light emitting display device of claim 11, wherein the anti-reflection layer includes:
a silicon nitride layer disposed directly on the uneven conductive portion of the conductive layer; and
a silicon oxide layer disposed directly on an uneven surface of the silicon nitride layer.

14. The organic light emitting display device of claim 1, wherein the light emitting layer includes:
a first electrode electrically connected to the circuit element layer;
a light emitting layer provided on the first electrode; and
a second electrode provided on the light emitting layer.

15. The organic light emitting display device of claim 1, further comprising:
a touch sensor provided on the light emitting element layer to detect a touch.

16. An organic light emitting display device, comprising:
a photodiode for detecting reflected light reflected from at least one of a fingerprint and a finger associated with the fingerprint, wherein the photodiode includes a semiconductor layer and a conductive layer provided on the semiconductor layer, and wherein the semiconductor layer comprises a lower doped region, a channel region, and an upper doped region sequentially stacked in a thickness direction, and the channel region has an uneven semiconductor surface, and the upper doped region has an uneven portion corresponding to the uneven semiconductor surface;

a transistor electrically connected to the photodiode;

a slit pattern layer overlapping both the photodiode and the transistor for concentrating light directed to the photodiode;

a circuit element layer disposed on the slit pattern layer; and a light emitting element layer disposed on the circuit element layer for displaying an image, the light emitting element layer being controlled by the circuit element layer, wherein the conductive layer is directly connected to only one bias electrode, and wherein the uneven portion of the upper doped region directly contacts an uneven conductive portion of the conductive layer.

17. The organic light emitting display device of claim 16, wherein the photodiode further includes:
a protection layer provided covering the semiconductor layer and the conductive layer.

18. The organic light emitting display device of claim 17, wherein the photodiode further includes:
at least one inorganic layer disposed directly on the uneven conductive surface of the conductive layer.

19. A method for manufacturing an organic light emitting display device, the method comprising:
providing a photodiode for detecting a reflected light reflected from at least one of a fingerprint and a finger associated with the fingerprint, wherein the photodiode includes a semiconductor layer and a conductive layer, wherein the semiconductor layer comprises a lower doped region, a channel region, and an upper doped region sequentially stacked in a thickness direction, wherein the channel region has an uneven semiconductor surface, wherein the upper doped region has an uneven portion corresponding to the uneven semiconductor surface, wherein the conductive layer is directly connected to only one bias electrode, wherein the uneven portion of the upper doped region directly contacts an uneven conductive portion of the conductive layer, and wherein the uneven semiconductor surface is formed through alkaline etching or plasma etching;

providing a transistor that is electrically connected to the photodiode;

providing a slit pattern layer that overlaps both the photodiode and the transistor for concentrating light directed to the photodiode;

providing a circuit element layer on the slit pattern layer; and providing a light emitting element layer on the circuit element layer for displaying an image.

\* \* \* \* \*